United States Patent
Pitzele et al.

(10) Patent No.: US 7,765,687 B2
(45) Date of Patent: Aug. 3, 2010

(54) METHOD FOR MECHANICAL PACKAGING OF ELECTRONICS

(75) Inventors: Lennart Pitzele, Princeton, MA (US); Abram P. Dancy, Shrewsbury, MA (US); Leif E. LaWhite, North Thetford, VT (US); Rene Hemond, Plainville, MA (US); Martin F. Schlecht, Lexington, MA (US)

(73) Assignee: SynQor, Inc., Boxborough, MA (US)

( * ) Notice: Subject to any disclaimer, the term of this patent is extended or adjusted under 35 U.S.C. 154(b) by 90 days.

(21) Appl. No.: 11/503,874

(22) Filed: Aug. 11, 2006

(65) Prior Publication Data

US 2007/0089293 A1  Apr. 26, 2007

Related U.S. Application Data

(60) Provisional application No. 60/707,605, filed on Aug. 11, 2005.

(51) Int. Cl.
 *H05K 7/14* (2006.01)
 *H05K 7/20* (2006.01)
 *H05K 13/00* (2006.01)

(52) U.S. Cl. .............................. 29/841; 29/855; 174/51; 174/521; 174/526; 174/528; 174/548; 174/551; 206/706; 361/736; 361/740; 361/753; 361/759

(58) Field of Classification Search .................... 29/832, 29/837, 841, 854–856, 876; 174/51, 520, 174/521, 526, 527, 528, 547, 548, 549, 551, 174/555, 556; 361/730, 796, 800, 736, 737, 361/740, 741, 753, 756, 759; 206/706, 707, 206/708, 723, 724, 726
See application file for complete search history.

(56) References Cited

U.S. PATENT DOCUMENTS

| | | | | |
|---|---|---|---|---|
| 4,587,593 A | * | 5/1986 | Liautaud et al. | 361/690 |
| 5,375,040 A | * | 12/1994 | Cooper et al. | 361/730 |
| 5,502,892 A | * | 4/1996 | Lien | 29/841 |
| 5,541,448 A | * | 7/1996 | Carpenter | 257/679 |
| 6,275,385 B1 | * | 8/2001 | Sahara et al. | 361/752 |

FOREIGN PATENT DOCUMENTS

JP  09099679 A  *  4/1997
WO  WO 9738443 A1  *  10/1997

OTHER PUBLICATIONS

Machine Translation of JP09-099679.*

* cited by examiner

*Primary Examiner*—A. Dexter Tugbang
*Assistant Examiner*—Livius R Cazan
(74) *Attorney, Agent, or Firm*—Hamilton, Brook, Smith & Reynolds, P.C.

(57) ABSTRACT

Electronics mounted on a printed circuit board are housed within a high conductivity case with connecting pins extending therethrough. The case is filled with thermally conductive potting material to provide thermal conduction from the printed circuit board to the case. The case may be a conduit having open ends through which the printed circuit board is inserted or it may comprise a cover mounted to a base plate.

22 Claims, 7 Drawing Sheets

METHOD FOR MECHANICAL PACKAGING OF ELECTRONICS

RELATED APPLICATION

This application claims the benefit of U.S. Provisional Application No. 60/707,605, filed on Aug. 11, 2005. The entire teachings of the above application are incorporated herein by reference.

BACKGROUND OF THE INVENTION

There are standard package designs for certain types of military grade DC-DC converters, filters and other electronic circuits such as those shown in FIGS. 1 and 2. The typical prior art for constructing these circuits and assembling them in their packages is shown in FIG. 3. A ring frame 301 (typically KOVAR) is welded to a base plate 302 (typically Molybdenum). A ceramic substrate 303 (typically Alumina, Aluminum Nitride, or Beryllium Oxide) is bonded to the base plate using epoxies or solder alloys if the substrate is suitably plated. Electronic components are soldered to the substrate which also contains thick and or thin film conductors. Most of the active microcircuits 304 (e.g. MOSFETs, diodes, control IC's) are soldered or epoxied to the substrate as bare die and wire bonded for connectivity. Magnetic devices 305 (e.g. transformer and inductors) are also surface mounted to the substrate. Input and output (I/O) pins 306 enter and exit the ring frame through holes with hermetic glass seals 307 that also provide electrical isolation between the pins and the ring frame. The I/O pins are wire bonded to the substrate or connected using L shaped brackets. A thin cover 308 (typically stainless steel) is seam soldered or welded to the ring frame in a vacuum so that there are no opportunities for penetration of external corrosive elements that would attack the bare silicon devices inside. The selection of all of the materials are carefully made in order to minimize differences in thermal expansion properties between the silicon of the active microcircuits, ceramic substrate, metal base plate, and glass seals.

SUMMARY OF THE INVENTION

The technology described above has been in use for decades, but it has several disadvantages. The substrates are prone to fracture during fabrication, mounting of electronic components, base plate attachment and use in the field. The substrate mounting to the base plate permits the attachment of electronic components from one side only. The thick film conductors are expensive to produce and have inferior electrical conductivity compared to pure metals and can only be fabricated in limited thicknesses, resulting in relatively high electrical resistances which reduce the efficiency. The layer count on thick film substrates is limited and is typically only one or two layers. Interconnection between components is limited because of the low layer count and limitations on the use of vertical integration access (vias). Magnetic devices 305 (transformers and inductors) must be hand-assembled and surface mounted to the substrate. Handling and assembly of the bare silicon microcircuits requires the use of expensive clean room environments and specialized handling and even dress of assembly personnel. The wire bonds that connect the microcircuits to the substrate are prone to fatigue or tensile failures under extreme vibration or acceleration conditions. The use of Molybdenum and KOVAR result in a heavy package. The glass seals must be handled carefully to avoid fracture. All of the material systems as described above require assembly processes that are not conducive to low cost, high volume manufacturing. Furthermore, the final assembly has a limited ability to withstand shock and vibration stresses encountered under service conditions.

Disclosed are novel methods for the mechanical packaging of High Reliability (Hi-Rel) DC-DC converters, filters, or other such electronic circuits for military or industrial applications.

There is a need for cost effective mechanical packaging for Hi-Rel converters and filter modules which enable advances in electronic performance while maintaining physical integrity and reducing product weight. The advent of suitable plastic packaged electronic components now permits their use in products that were typically produced in hermetically sealed enclosures. These plastic device packages provide sufficient protection for the active microcircuits contained within so that the exterior mechanical packaging itself is no longer required to be hermetically sealed.

The mechanical packaging is considered to be the enclosure that protects the electronic components from the diverse environmental stresses to be encountered such as, but not limited to, thermal extremes, mechanical shock and vibration, adverse chemical or sand exposures, etc. This packaging should be robust in order to provide the desired protection, but also be easy to produce and assemble in order to be cost effective.

DETAILED DESCRIPTION OF THE INVENTION

A description of preferred embodiments of the invention follows.

New methods for the design of a Hi-Rel mechanical package and the subsequent assembly of the circuit within it have been developed. The methods provide lower cost and are easier to produce using standard, high volume production methods and equipment.

Figure 1:
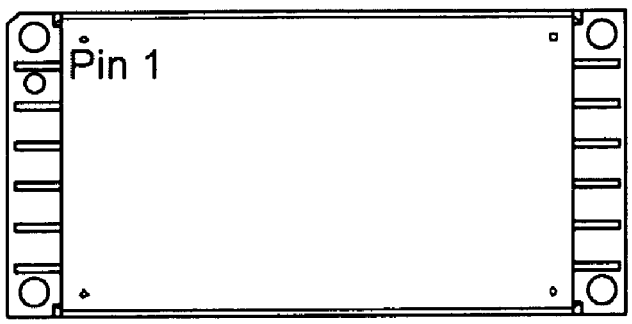
FIG. 1 illustrates a first standard package design for a Hi-Rel DC-DC converter or filter.
Figure 1:
Figure 1:
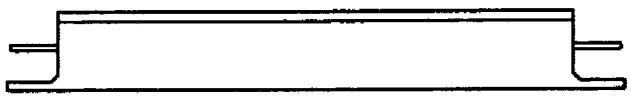
Figure 2:
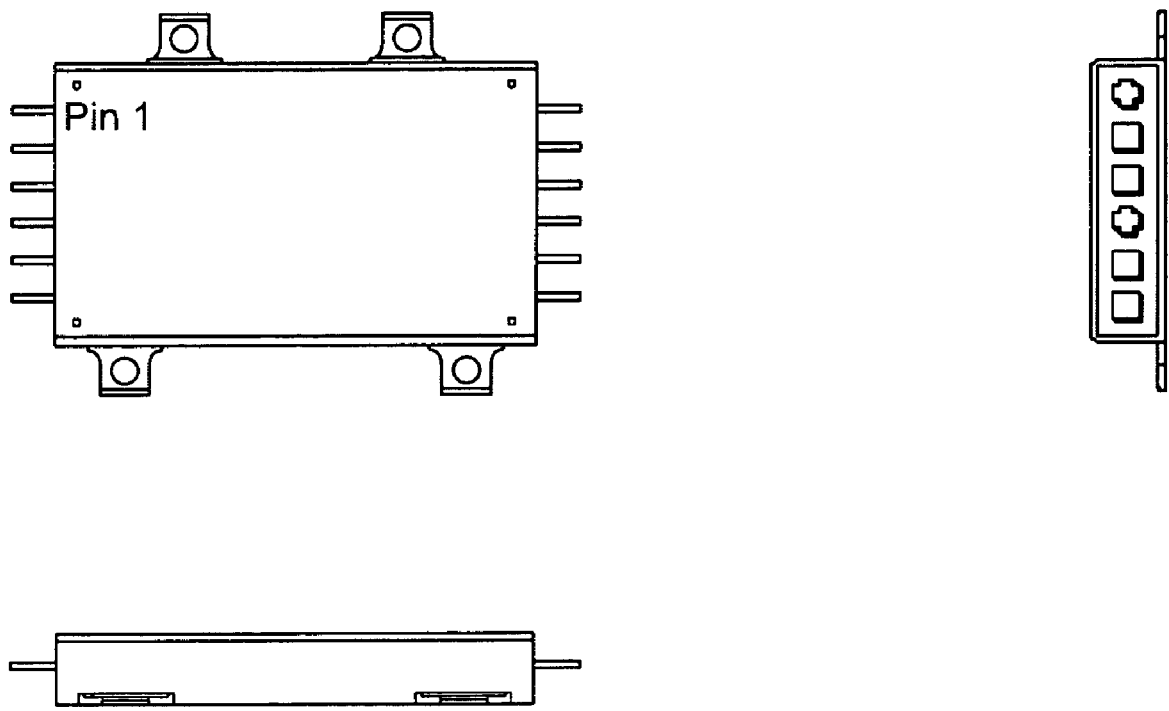
FIG. 2 illustrates a second standard package design for a Hi-Rel DC-DC converter or filter.
Figure 3:
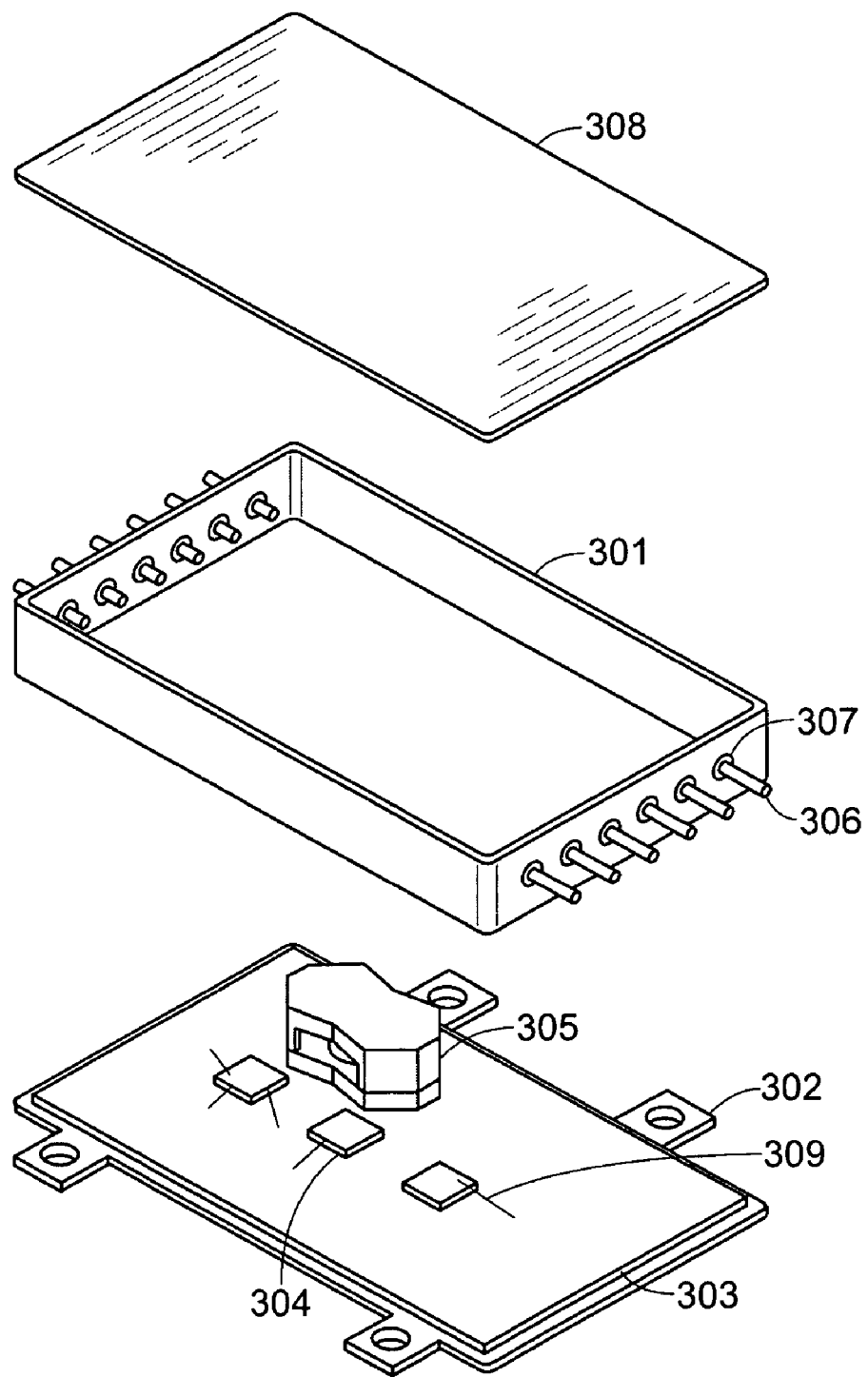
FIG. 3 in a detailed illustration showing how a Hi-Rel DC-DC converter or filter is assembled and placed in a standard package.
Figure 4:
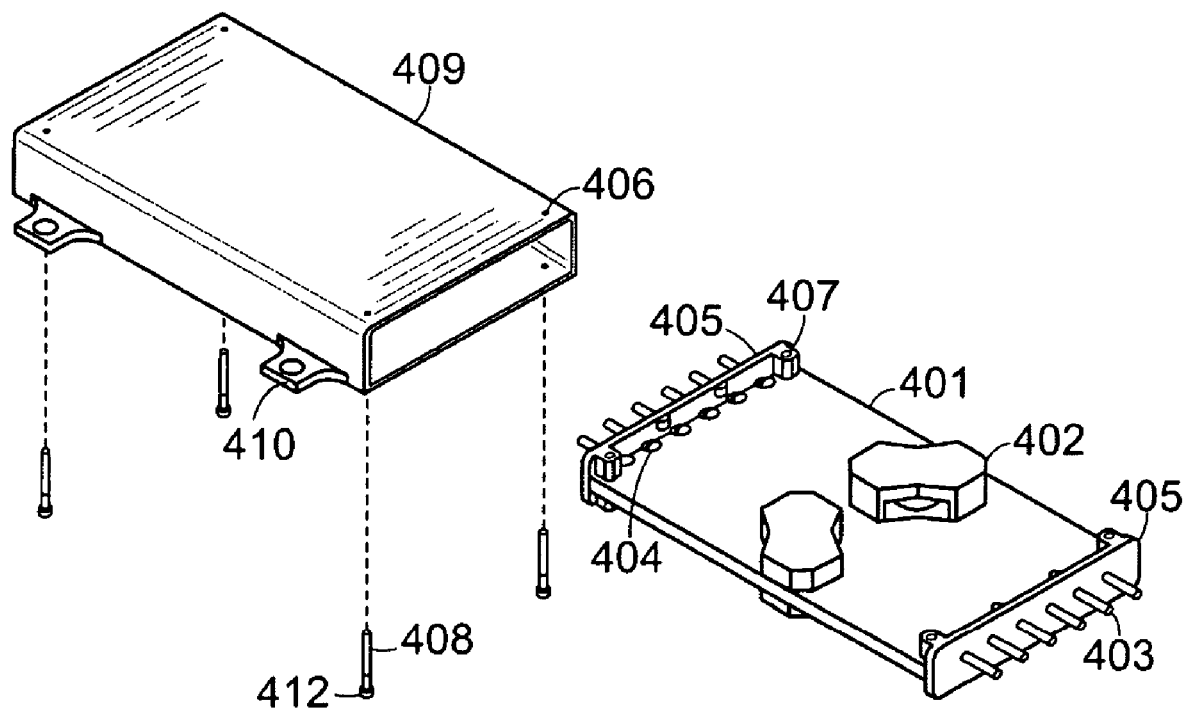
FIG. 4 is a detailed illustration showing a new approach for how a Hi-Rel DC-DC converter or filter can be assembled and placed in a new package design.

FIG. 4 shows an exploded view of one embodiment of the new construction/assembly. The basic principles of this method are as follows.

The substrate is made from a printed circuit board 401 (PCB) fabricated from layers of fiberglass and copper foil. PCB assemblies are inherently more mechanically robust than ceramic substrate assemblies. The PCB enables the use of pure metal, multiple layers (8-12 typical), and metal thicknesses up to 6 times those of typical thick film conductions. The conductor layers are made from copper foil, and provide higher conductivity resulting in significantly lower interconnection resistance and a resulting increase in efficiency of conversion. Planar windings can be made as part of the PCB fabrication and used for the magnetic devices 402 (transformers and inductors), further improving efficiency while reducing fabrication and assembly costs. The PCB is also able to have components mounted on both of its sides, improving component density and enabling more functionality and performance. The multiple layers of the PCB and the use of vias connecting various layers simplify interconnection. The components are assembled and soldered to either side of the PCB using standard Surface-Mount Technology equipment and do not require clean room environments or handling. There need be no delicate wire bonds in this construction.

The I/O pins 403 are soldered directly to the PCB using semi-circular attachment sites 404. The latter are formed as part of the PCB fabrication process. A plastic/insulating header 405 at each end of the PCB provides accurate positioning of the I/O pins within the package and provides mechanical strain relief for the I/O pins. Locating features on the PCB and header are used for alignment of the I/O pins to the PCB during soldering.

The PCB/Header/Pin subassembly can optionally be conformal-coated with various material systems (e.g. PARYLENE C) for enhanced chemical resistance and electrical isolation.

The base plate, ring frame, and cover from the prior art are all replaced by a single extruded case 409 (typically made from Aluminum). This case is machined to provide the required mounting features 410. The aluminum case is lighter and less expensive to produce than the prior system elements. The case is finished (e.g. hard anodized or zinc chromated, a.k.a. ALODINE) in order to provide corrosion resistance. The PCB/Header/Pin subassembly slides into an opening at either end of the case. The case has case locating holes 406 that align with the PCB/Header locating holes 407 in the PCB and headers.

Locking pins 408 (typically made from stainless steel) are press fit into the locating holes on the case and lock the sub assembly in place. The locking pins have features that press fit into the PCB as well, providing connection from the case to the PCB, and subsequently to a 'Case Pin' for electrical grounding and shielding purposes. The features may be edges that cut into the case and PCB to provide a swage fit and enhance electrical contact to the PCB and case. The locking pins also have heads 412 on them so that they cannot vibrate loose outwardly. The locking pins are inserted from the bottom of the unit, with their heads set in recesses in the case, so that they are entrapped when the unit is mounted to a heat removal plate in the end application and thus cannot vibrate loose in the other (inward) direction.

Figure 7:
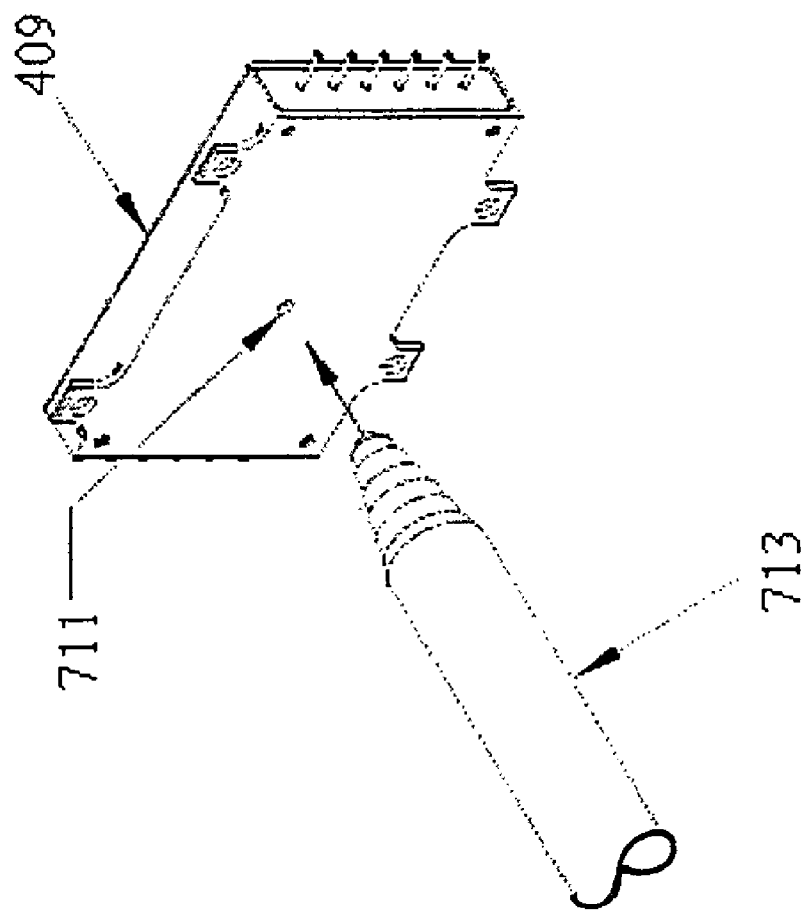
FIG. 7 illustrates injecting a thermally conductive potting material into a new package design.

As shown in FIG. 7, the case 409 also has a hole 711 in the bottom into which a thermal potting compound is injected from an injector 713. The thermal compound (typically made from a mixture of RTV silicone elastomer and Aluminum Oxide powder) provides a thermal path for heat transfer from the electronic components and PCB to the case for transfer to the external cooling medium. The thermal compound is elastic and provides attenuation for vibration and shock excitation without placing stress on the electronic components, enhancing the mechanical reliability of the package. This construction enables a significant improvement in the ability of the new package to withstand shock and vibration conditions that far exceed those that could be handled by the prior art. It should be noted that while the package itself and the points at which the leads exit the package have been demonstrated to be capable of withstanding vibration levels exceeding those of the prior art, care must still be taken to ensure that the electrical connections to the package are made in a manner consistent with survival under extreme shock and vibration conditions.

Figure 5:
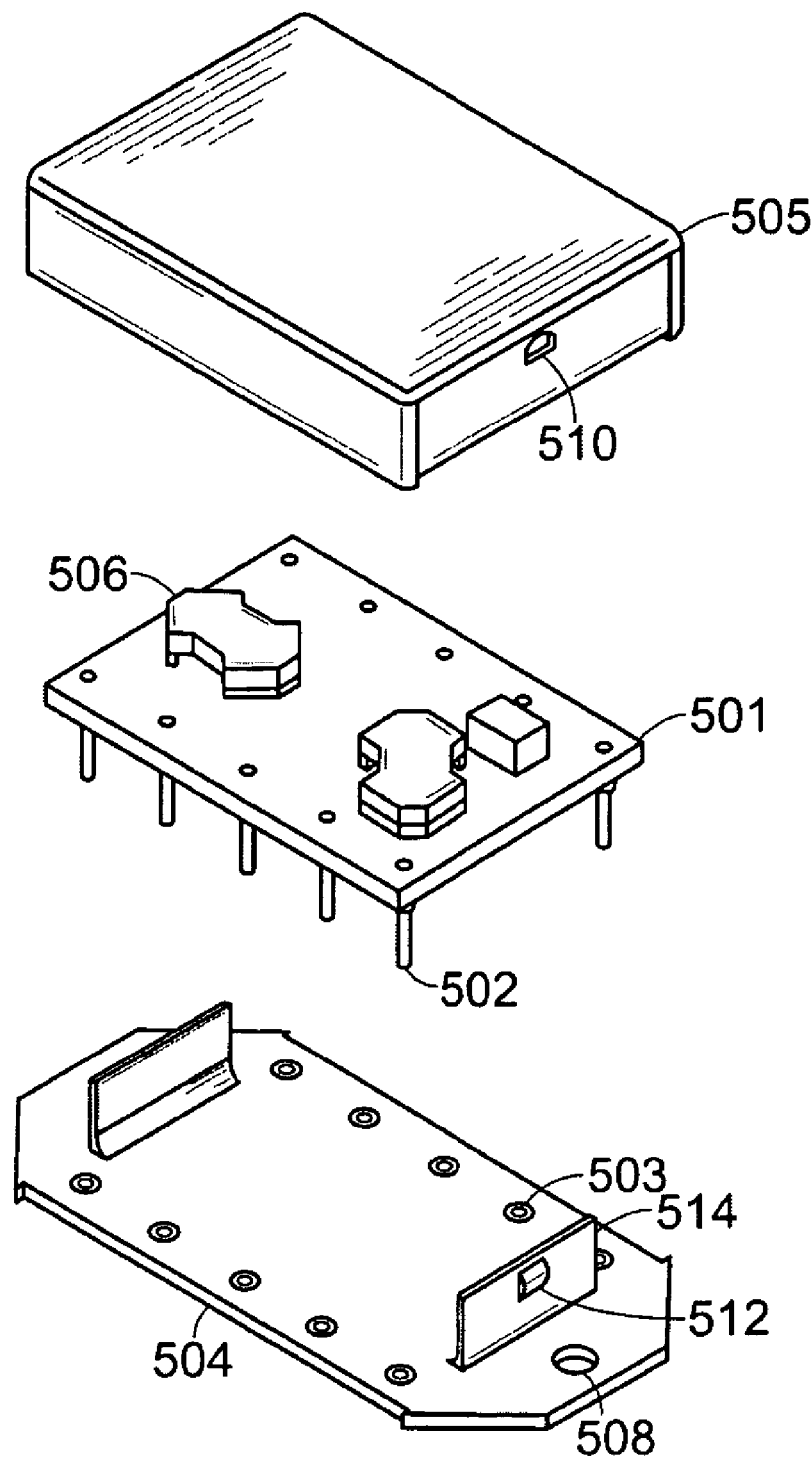
FIG. 5 is a detailed illustration showing another new approach for how a Hi-Rel DC-DC converter or filter can be assembled and placed in a new package design.

Another assembly with a different form factor has also been developed. FIG. 5 shows an exploded view of another method for packaging PCB based converters, filters, or other types of Hi-Rel circuitry.

The PCB assembly 501 has I/O pins 502 that are inserted into it during SMT assembly and protrude from the bottom side. These I/O pins slip or press fit into insulating bushings 503 that have previously been press-fit into an anodized aluminum base plate 504. The base plate can be fabricated by a variety of conventional metal forming processes such as casting, extrusion and/or machining processes. The bushings, which can be made using processes such as injection molding or machining, provide electrical isolation between individual I/O pins and the case. A case ground connection is achieved by press fitting the pin directly into an appropriately sized hole in the base plate.

Figure 6A:
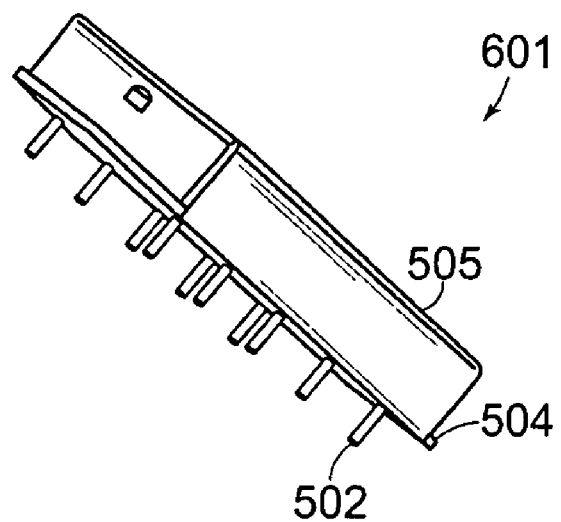
FIGS. 6A and 6B illustrate the package design depicted in FIG. 5 fully assembled.
Figure 6B:
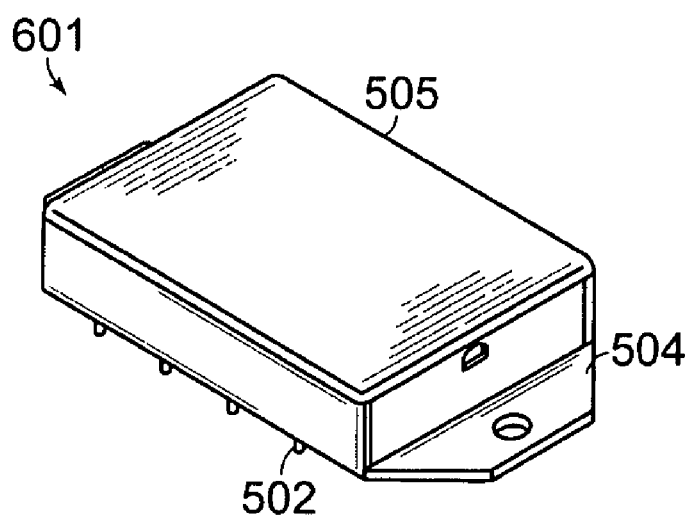

A cover 505 is installed onto the base plate to provide a complete enclosure. Overlapping seams are used to minimize openings for radiated electromagnetic interference (EMI). The cover is affixed to the base plate using built in features such as a snap fit, screws, epoxy or a combination of such methods. As illustrated, tangs 512 on uprights 514 snap into openings 510 in the cover to retain the cover on the base plate. The interior region is then filled with a thermally conductive material via a hole located on one of the six external surfaces. Locking pins may also be added in the same manner as described above to provide case grounding. The fully assembled product 601 is shown in FIGS. 6A and 6B.

The resulting mechanical packages made using the above methods are lighter and less expensive to produce than the prior art and can easily be assembled using simple, standard, cost effective techniques. This new packaging method has been tested under shock, vibration and other stringent environmental conditions as described in MIL-STD-810 and MIL-STS-883, and it meets or exceeds the applicable requirements.

While this invention has been particularly shown and described with references to preferred embodiments thereof, it will be understood by those skilled in the art that various changes in form and details may be made therein without departing from the scope of the invention encompassed by the appended claims

What is claimed is:

1. A method of packaging electronics comprising:
   providing the electronics on a printed circuit board having connecting pins extending from opposite ends thereof;
   sliding the printed circuit board, beginning with one end of the circuit board having connecting pins, into an open end of a four sided metal case, where two opposite sides of the metal case are parallel to faces of the printed circuit board;
   with the connecting pins extending from opposite ends of the case, locking the printed circuit board in place within the metal case by extending locking pins through holes in the metal case and then into the printed circuit board, wherein each locking pin has a head recessed in a bottom of the metal case and the bottom of the metal case is mounted to a heat removal plate external to the case, so that each locking pin is entrapped between the case and the heat removal plate when the metal case is mounted to the heat removal plate; and
   filling the case with a thermally conductive potting material to provide thermal conduction from the printed circuit board to the case.

2. The method as claimed in claim 1, wherein the printed circuit board is conformal-coated.

3. The method as claimed in claim 2, wherein the printed circuit board is conformal-coated with PARYLENE C.

4. The method as claimed in claim 3, wherein the thermally conductive potting material comprises a mixture of elastomer and ceramic.

5. The method as claimed in claim 4, wherein the ceramic is aluminum oxide.

6. The method as claimed in claim 5, wherein the elastomer is a silicone elastomer.

7. The method as claimed in claim 1, wherein the thermally conductive potting material comprises a mixture of silicone elastomer and aluminum oxide powder.

8. The method as claimed in claim 1, wherein the locking pins make electrical connection between the printed circuit board and the case.

9. The method as claimed in claim 8, wherein the locking pins have features that cut into the printed circuit board and case.

10. The method as claimed in claim 1, further comprising coupling a header to each end of the printed circuit board to support the connecting pins.

11. The method as claimed in claim 10, further comprising mounting electronic components on both sides of the printed circuit board.

12. The method as claimed in claim 11, wherein the components are mounted using surface-mounted technology.

13. A method of packaging electronics comprising:
providing electronics on a printed circuit board;
coupling a header to each end of the printed circuit board, the header supporting connecting pins to the printed circuit board;
sliding the printed circuit board, beginning with one end of the circuit board having connecting pins, into an open end of a four sided metal case, where two opposing sides of the metal case are parallel to faces of the printed circuit board;
locking the printed circuit board in place within the metal case, wherein locking the printed circuit board in place comprises extending locking pins through holes in the metal case and then into the printed circuit board, each locking pin with a head recessed in the bottom of the metal case, and mounting the bottom of the metal case to a heat removal plate external to the case, so that each locking pin is entrapped between the case and the heat removal plate when the metal case is mounted to the heat removal plate; and
filling the case with a thermally conductive potting material to provide thermal conduction from the printed circuit board to the case.

14. The method as claimed in claim 13, wherein the printed circuit board is conformal-coated.

15. The method as claimed in claim 14, wherein the printed circuit board is conformal-coated with PARYLENE C.

16. The method as claimed in claim 15, wherein the thermally conductive potting material comprises a mixture of elastomer and ceramic.

17. The method as claimed in claim 16, wherein the ceramic is aluminum oxide.

18. The method as claimed in claim 17, wherein the elastomer is a silicone elastomer.

19. The method as claimed in claim 13, wherein the thermally conductive potting material comprises a mixture of silicone elastomer and aluminum oxide powder.

20. The method as claimed in claim 13, further comprising using the locking pins to make an electrical connection between the printed circuit board and the metal case.

21. The method as claimed in claim 20, wherein the locking pins have features that cut into the printed circuit board and case.

22. The method as claimed in claim 13, further comprising mounting electronic components on both sides of the printed circuit board.

* * * * *